(12) United States Patent　(10) Patent No.: US 7,204,068 B2
Neuhoff et al.　(45) Date of Patent: Apr. 17, 2007

(54) PACKAGING SYSTEM WITH A TOOL FOR ENCLOSING ELECTRONIC COMPONENTS AND METHOD OF POPULATING A CARRIER TAPE

(75) Inventors: Oskar Neuhoff, Nittendorf (DE); Peter Roider, Barbing (DE)

(73) Assignee: Infineon Technologies AG, Munich (DE)

( * ) Notice: Subject to any disclaimer, the term of this patent is extended or adjusted under 35 U.S.C. 154(b) by 49 days.

(21) Appl. No.: 10/511,945

(22) PCT Filed: Apr. 16, 2003

(86) PCT No.: PCT/DE03/01278

§ 371 (c)(1),
(2), (4) Date: Jun. 15, 2005

(87) PCT Pub. No.: WO03/089305

PCT Pub. Date: Oct. 30, 2003

(65) Prior Publication Data

US 2005/0230043 A1　Oct. 20, 2005

(30) Foreign Application Priority Data

Apr. 20, 2002　(DE) ............................... 102 17 792

(51) Int. Cl.
*B65B 3/04*　(2006.01)
*B65B 15/04*　(2006.01)
(52) U.S. Cl. ........................... 53/452; 53/467; 53/475; 53/558; 53/591
(58) Field of Classification Search ............... 53/450, 53/452, 453, 467, 475, 558, 242, 245, 246, 53/249, 373.5, 255, 373.7, 258, 374.3, 591, 53/393; 206/713, 714
See application file for complete search history.

(56) References Cited

U.S. PATENT DOCUMENTS

| | | | |
|---|---|---|---|
| 3,655,496 A | * | 4/1972 | Ettre et al. .................. 206/713 |
| 3,724,068 A | | 4/1973 | Galli |
| 4,406,367 A | | 9/1983 | Bouwknegt |
| 4,476,626 A | | 10/1984 | Gumbert et al. |
| 4,575,995 A | * | 3/1986 | Tabuchi et al. ............... 53/453 |
| 5,150,787 A | * | 9/1992 | Bird et al. .................. 206/714 |
| 5,203,143 A | | 4/1993 | Gutentag |
| 5,234,105 A | * | 8/1993 | Sato et al. .................. 206/714 |
| 5,524,765 A | * | 6/1996 | Gutentag ..................... 206/713 |
| 5,966,903 A | * | 10/1999 | Dudderar et al. ............. 53/397 |

(Continued)

FOREIGN PATENT DOCUMENTS

DE　31 13 546　2/1982

(Continued)

*Primary Examiner*—Louis Huynh
(74) *Attorney, Agent, or Firm*—Dicke, Billig & Czaja, PLLC

(57) ABSTRACT

The invention relates to a packaging system having a tool for inserting electronic components into a carrier tape, which has passage openings. The tool has a pick-up device to pick up the components from a carrier film and position them in the passage openings by means of a lifting movement. The packaging system has a guide plate for the linear sliding conveyance of the carrier tape populated with electronic components, and in each case devices for applying upper and lower cover films to the carrier tape. The invention additionally relates to a method of populating the carrier tape with electronic components.

17 Claims, 3 Drawing Sheets

U.S. PATENT DOCUMENTS

2004/0035747 A1 * 2/2004 Butler .................. 206/714
2005/0035025 A1 * 2/2005 Bosch .................. 206/713

FOREIGN PATENT DOCUMENTS

| EP | 0 565 781 | 11/1995 |
|----|-----------|---------|
| JP | 06151483 | 5/1994 |
| JP | 10050736 | 2/1998 |
| JP | 10084005 | 3/1998 |
| JP | 10084006 | 3/1998 |
| JP | 10084032 | 3/1998 |
| JP | 01053105 | 2/2001 |

* cited by examiner

PACKAGING SYSTEM WITH A TOOL FOR ENCLOSING ELECTRONIC COMPONENTS AND METHOD OF POPULATING A CARRIER TAPE

CROSS REFERENCE TO RELATED APPLICATIONS

This Utility Patent Application claims the benefit of the filing date of German Application No. DE 102 17 792.9, filed Apr. 20, 2002, and International application Ser. No. PCT/DE03/01278, filed Apr. 16, 2003, both of which are herein incoirorated by reference.

BACKGROUND

The invention relates to a packaging system with a tool for enclosing electronic components in a carrier tape, and a method of populating the carrier tape.

For the purpose of transport and delivery to an automatic placement machine, electronic components are often enclosed in what are known as carrying or transport tapes, which can be stored and transported in the rolled-up state. Transport tapes of this type have preformed tape pockets, in which electronic components can be arranged and transported in an accurate position, and can be removed from the transport tapes in an accurate position. For the purpose of transport, the tape pockets of a transport tapes are covered with the aid of a covering tape, so that the electronic components cannot fall out of the tape pockets and cannot change their position in relation to the three spatial axes until they are removed from the transport tapes.

During the introduction and positioning, in particular of small and/or lightweight electronic components and/or semiconductor chips, such as are needed in great numbers for integrated circuit technology, illumination and laser engineering and the like, rapid placement with a high throughput rate is associated with the risk that the components will jump out of the tape pockets and therefore hamper the placement operation of an automatic placement machine for transport tapes considerably. Not only does the placement have to be interrupted, but in principle the automatic machine has to look for the electronic components that have jumped out and the placement position of the automatic machine has to be redefined and readjusted.

A further problem in the placement of transport tapes with small and/or lightweight electronic components in the millmeter range is to be seen in the fact that the precision requirements both on the shaping of the tape pockets and on the automatic placement machines require continually increasing investment and development costs, in order to position the electronic components precisely and in an accurate position in the tape pockets, and in order to meet these precision requirements.

Electronic components are inserted into the pockets of the transport tape by means of a rotary cross or a pivoting arm. The electronic components are at this time already separated on the wafer or on the blank to such an extent that they can be separated from a carrier film and picked up by the pivoting arm. All the methods described need a relatively great deal of handling and are therefore associated with certain minimum cycle times.

Pick-up devices for handling and positioning semiconductor chips at their envisaged installation location are disclosed by JP 100 84 005 A, by JP 100 84 006 A and by JP 100 84 032 A. A device for positioning semiconductor chips is also disclosed by JP 061 51 483 A.

SUMMARY

One embodiment of the invention provides a device and a method for populating transport tapes with electronic components or semiconductor chips with which rapid, reliable and precise population with electronic components from transport tapes such as paper tapes with a double-sided film cover or blister tapes with a single-sided film cover is possible.

According to one embodiment of the invention, a packaging system is provided with a guide plate for the linear guidance of a carrier tape that can be populated with electronic components or with semiconductor chips. The guidance can be carried out horizontally in a sliding manner. The guide plate has a passage opening.

The packaging system has a carrier-tape populating tool, which has a vacuum pipette and a lifting needle, which can also generally be constructed as a lifting device. In this case, the vacuum pipette is designed in such a way that it can pick up an electronic component in each case or a semiconductor chip in each case from above. The lifting needle can be constructed in such a way that it guides the electronic component or the semiconductor chip from below.

The vacuum pipette and the lifting needle are intended to pick up vertically in each case an electronic component or semiconductor chip provided on a carrier film or carrier plate and to position the electronic component or semiconductor chip picked up in each case in a cavity or a passage opening in each case on a carrier tape. In this case, the vacuum pipette and/or the lifting needle can in each case carry out a lifting movement and move in and/or through the passage opening in the guide plate.

The components are wiped off the vacuum pipette, specifically in particular by the movement of the carrier tape in the transport direction.

The packaging system further comprises at least one upper cover film device for applying an upper cover film and/or a lower cover film device for applying a lower cover film to the carrier tape.

According to another embodiment of the invention, the packaging system according to the invention comprises a tool for inserting electronic components into a carrier tape, which has passage openings to hold individual electronic components. The tool has a pick-up device with a vacuum pipette and a lifting needle to pick up the electronic components vertically from a carrier film or carrier plate and to position the components in the passage openings by means of a lifting movement of the vacuum forceps. The carrier tape is guided in the horizontal transport direction in such a way that it wipes the components off the vacuum pipette in the transport direction. The packaging system also has a guide plate for the linear, sliding horizontal conveyance of the carrier tape populated with electronic components, and in each case devices for applying an upper and a lower cover film to the carrier tape.

The packaging system according to this embodiment of the invention has only minimal handling movement to pick up and transfer electronic components located on a blank into a carrier tape. The components merely have to be pushed upwards by means of a linear lifting movement, so that no kind of complicated handling steps or method steps of the vacuum pipette are necessary. In addition, no additional tools or aids are required in order to remove the electronic components from a vacuum pipette, since this task is performed by the carrier tape to be populated. Wiping the electronic component of the vacuum pipette by means of the carrier tape is a procedure which treats the electronic component gently. By using a vacuum pipette which has a central capillary that is evacuated during the lifting operation and during the wiping operation, the component and in particular the upper side of the component are treated gently. To this end, the vacuum pipette has at its tip a highly polished minimum contact surface, onto which the upper side of the component is pressed. This contact surface can belong to a Teflon tip, which is correspondingly compliant, and does not damage the upper side of the component. In the case of metallic vacuum pipettes, the contact surface can additionally be hardened, in order to achieve long service lives. Hardening of this type can be carried out by means of diffusion hardening, which means that no additional surface layer is built up. In the case of what is known as "Kolsterising", hardnesses from about 1200 to 1300 Vickers are achieved without additional material being applied.

A further advantage of the vacuum pipette with its highly polished minimum contact surface is that a small amount of vacuum power is sufficient to hold the component with the evacuated capillary. Furthermore, adjustment and adaptation of the vacuum pipette both to the thickness of the components and to the thickness of the carrier tapes are possible with simple means.

According to one embodiment of the invention, the pick-up device is a vacuum pipette, which permits gentle and secure handling of the electronic components. According to a further embodiment of the invention, the vacuum pipette has a lifting direction at right angles to the conveying direction of the carrier tape and through the passage openings in the latter. Just like the vacuum pipette, the lifting needle in one embodiment also has a lifting direction at right angles to the conveying direction of the carrier tape and as far as the lower edge of the passage openings in the latter. The only minimal lifting movements of the vacuum pipette and of the lifting needle ensure exact positioning and deposition of the electronic components in the carrier tape. According to one embodiment of the invention, the lifting movements of the lifting needle are synchronised with the lifting movements of the vacuum pipette, and the vacuum is maintained until the transport tape moving forward has wiped the electronic component off the mouthpiece of the vacuum pipette.

An alternative embodiment of the invention provides for at least the vacuum pipette to have a horizontal movement component in the same direction as the conveying direction of the carrier tape as it inserts an electronic component into a passage opening. This horizontal movement component of the vacuum pipette reliably prevents the electronic components falling out downwards after the vacuum has been removed.

The electronic components can be picked up and deposited in the carrier tape particularly simply if they are applied to a component carrier or a blank in rows and/or columns and are held together by a carrier film.

The component carrier or the blank with the carrier film, according to a further embodiment of the invention, is applied to a support table that can be displaced horizontally, which makes rapid and accurate displacement and positioning of the electronic components underneath the carrier tape easier. In one embodiment, the support table can be displaced in a first horizontal direction parallel to the conveying direction of the carrier tape and in a second horizontal direction at right angles thereto.

In order to separate the electronic components from the blank or the carrier foil without difficulty, the support table has a second opening of larger diameter than the lifting needle, which can in each case be moved into a position located vertically underneath a passage opening in the carrying tape. The lifting needle can be pushed through this opening and, together with the vacuum pipette, can convey the respective electronic component into the carrier tape.

In one embodiment, the guide plate has a first opening of larger diameter than an outline of an electronic component, through which opening the linear lifting axes of the vacuum pipette and of the lifting needle extend centrally. Located directly above this first opening is the passage opening in the carrier tape, into which an electronic component is deposited in each case.

According to a further embodiment of the invention, downstream of the pick-up device in the conveying direction of the carrier tape, the packaging system has feed devices for the lower cover film and for the upper cover film. The latter are pressed onto the underside and upper side of the tape by means of deflection rollers and by a pressing device in each case, and are connected to the said tape. This can be carried out, for example, by means of a heating device or else by adhesive bonding. The feed device for the upper cover film is arranged downstream, in the conveying direction of the carrier tape, of the feed device for the lower cover film.

In order that the electronic components cannot fall through their feed slot in the guide plate when the lower cover film is being applied, a vacuum suction device is provided above the feed device for the lower cover film, by means of which the electronic components are held in the passage opening.

The method according to one embodiment of the invention for populating a carrier tape with electronic components has the following steps. A carrier tape is provided with passage openings for a packaging system for populating with electronic components. By means of a vacuum pipette, individual electronic components are picked up from a support table arranged underneath the conveying plate of the packaging system. In each case an electronic component is introduced into each passage opening in the carrier tape by means of a vertical lifting movement of the vacuum pipette that lifts the electronic component. The electronic component is then wiped off the vacuum pipette with the aid of the carrier tape. An upper side of a tape is closed by applying an upper cover film. In the same way, an underside of a tape is closed by applying a lower cover film.

With this method, the electronic component is transferred extremely gently into the passage openings or cavities in the carrier tape, since the contact surface of the vacuum pipette is extremely small and wiping the electronic component off in the horizontal direction from this contact surface does not represent any loading on the electronic component.

A configuration of the method according to one embodiment of the invention provides for the electronic components to be picked up from above by a vacuum pipette and from below by a lifting needle, which permits exact deposition of the components in the carrier tape. In one embodiment, the vacuum pipette and the lifting needle carry out a vertical lifting movement through a first opening in the guide plate, while the transport tape is moved transversely thereto and wipes the electronic component off the vacuum pipette in the transport direction.

An alternative embodiment of the method according to the invention provides for at least the vacuum pipette to carry out a horizontal movement with the conveying direction of the carrier tape as it inserts the electronic component into a passage opening in the latter, as a result of which the electronic components are reliably prevented from falling out downwards through the first opening after the vacuum to the vacuum pipette has been switched off.

The lower cover film is applied to the carrier tape from below through a feed slot in the guide plate. In order that the electronic components cannot fall down through this feed slot, a vacuum suction device is provided above the feed device for the lower cover film.

The upper and lower cover film in each case be applied in an adhesive manner by means of a heating device to the upper side and lower side of the tape. Alternatively, the cover films can also be adhesively bonded to the carrier tape. In one embodiment, the carrier tape used is a paper tape. The cover films are in one embodiment made of thermoplastic or likewise of paper.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
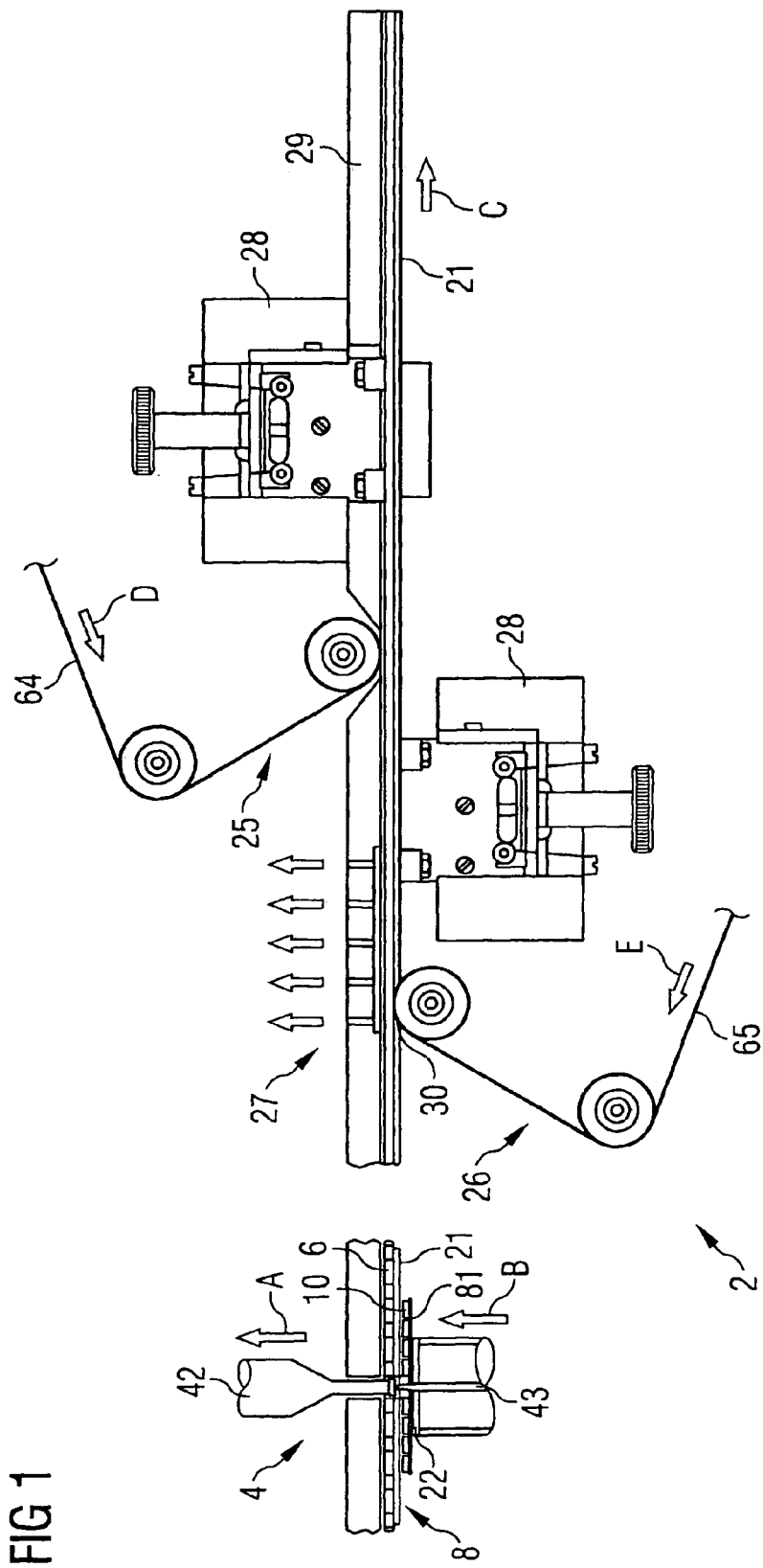
FIG. 1 illustrates a schematic illustration of a packaging system according to the invention having a tool for inserting electronic components into a carrier tape.

FIG. 1 illustrates a schematic cross-section of a packaging system 2 according to the invention having a tool 4 for inserting electronic components 10 into a carrier tape 6. The tool 4 comprises a pick-up device 41 for picking up and transferring electronic components 10 which are in groups on a blank 8. By means of the pick-up device 41, which substantially comprises a vacuum pipette 42 and a lifting needle 43, individual electronic components 10 are separated from a carrier film 81 belonging to the blank 8 and placed in passage openings 63 in the carrier tape 6.

The carrier tape 6 in one embodiment consists of paper and is conveyed in a sliding manner on a guide plate 21. The guide plate 21 extends over a sufficient length such that, in the conveying direction C behind the tool 4, sufficient space remains to apply an upper cover film 64 to an upper side 61 of the tape and a lower cover film 65 to an underside 62 of the tape. For this purpose, the feed device 26 for the lower cover film 65 is provided on the underside of the guide plate 21, by means of which the lower cover film 65 is led up to the underside 62 of the tape over a plurality of deflection rollers (conveying direction E).

Above the feed device 26 for the lower cover film 65 there is provided a vacuum suction device 27, by means of which the electronic components 10 lying in the passage openings 63 in the carrier tape 6 and pushed along on the guide plate 21 by the latter are sucked upwards to a guide covering 29 of the guide plate 21 and are prevented from falling out downwards from a feed slot 32 for the lower cover film 65.

Behind the feed device 26 for the lower cover film 65, in the conveying direction C of the carrier tape 6, there is arranged a feed device 25 for an upper cover film 64, by means of which the upper cover film 64 is led up to the upper side 61 of the tape over a plurality of deflection rollers (conveying direction D). By means of heating devices 28, the upper and lower cover films 64, 65 are firmly connected in adhesive manner to the carrier tape 6. By means of the cover films 64, 65 the electronic components 10 are prevented from falling out of the passage openings 63 in the carrier tape 6. The cover films 64, 65 in one embodiment consist of a thermoplastic and are melted point by point by means of the heating devices 28 and connected to the paper carrier tape 6. Alternatively, instead of the heating devices 28, provision can also be made for possible ways of connecting the cover films 64, 65 to the carrier tape 6 by means of adhesive bonds.

The carrier tape 6, after being populated with the electronic components 10, can be wound up onto a roll, which means it is suitable to be transported and delivered to an assembly line.

Figure 2:
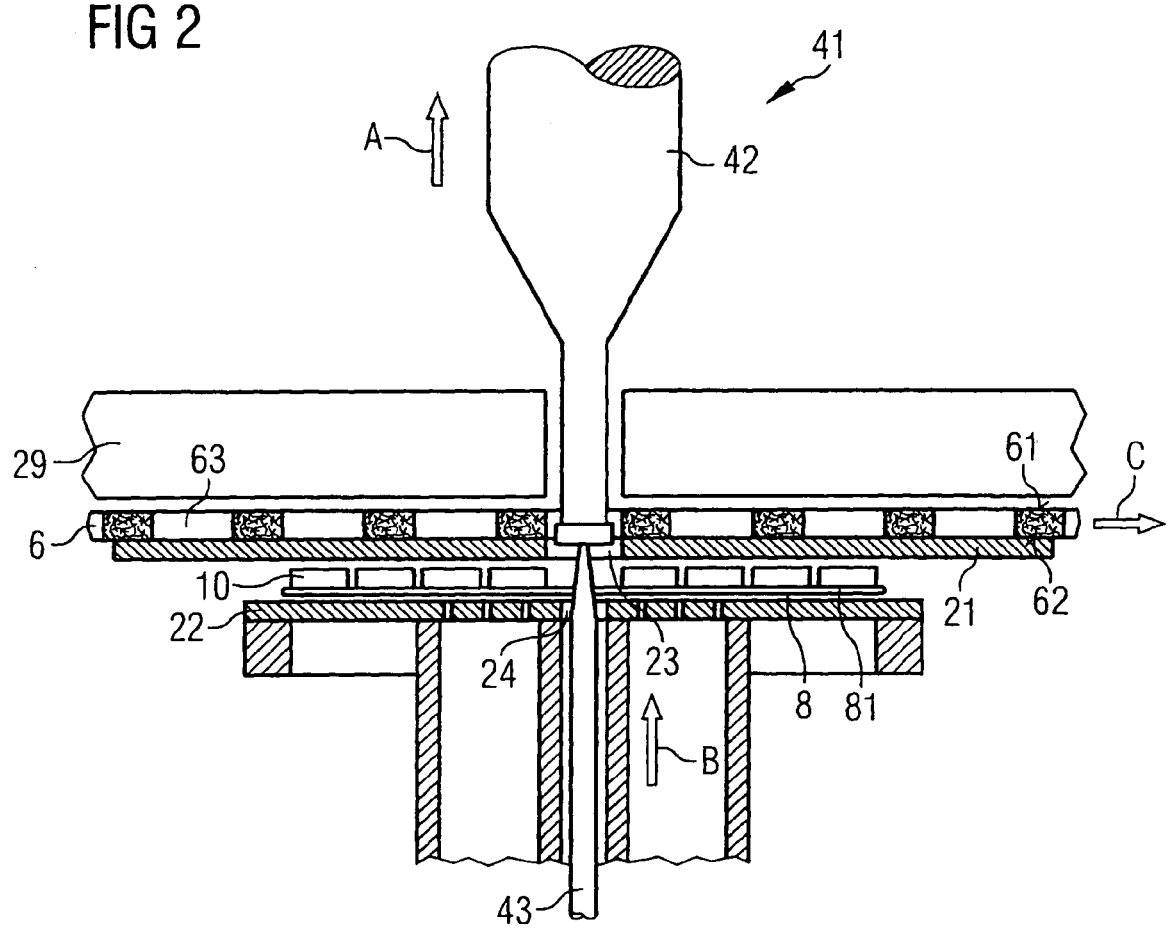
FIG. 2 illustrates a detailed extract from the packaging system corresponding to FIG. 1.

FIG. 2 illustrates, in a schematic cross-section, a detailed extract from the packaging system 2 corresponding to FIG. 1. In this case, the actions of picking up and transferring the electronic components 10 from the blank 8 into the carrier tape 6 are illustrated.

The blank 8 comprises a carrier film 81, on which the electronic components 10 are fitted in an adhesive manner in rows and columns. The carrier film 81 rests with its underside on a support table 22, which can be displaced in the horizontal direction. In one embodiment, the support table 22 can be displaced in the conveying direction C of the carrier tape 6 and at right angles thereto. Provided centrally in the support table 22, what is known as the vacuum mushroom, a second passage opening 24 is provided, through which a lifting needle 43 can be moved vertically upwards (lifting direction B). While the component is being lifted, vacuum is applied to the vacuum mushroom in order to hold the adhesive film 81 on the vacuum mushroom.

The support table 22 is located immediately underneath the guide plate 21, so that an electronic component 10 can be conveyed directly from the blank 81 into a passage opening 63 in the carrier tape 6 by means of the pick-up device 41 of the tool 4 and can be deposited there. For this purpose, the vacuum pipette 42 can be moved through a first opening 23 in the guide plate 21, downwards through the latter, in the direction opposite to the lifting direction A, and placed on an upper side of an electronic component 10. At the same time, the lifting needle 43 is pressed against the carrier film 81 from below. By means of a simultaneous lifting movement of the lifting needle 43 and of the vacuum pipette (lifting directions A, B), the electronic component 10 is lifted off the carrier film 81 of the blank 8, the lifting needle 43 piercing the carrier film 81.

The pick-up device 41 is moved vertically upwards until the electronic component 10 is positioned in the passage opening 63 in the carrier tape 6. The carrier tape 6 is displaced to the right on the guide plate 21, in the conveying direction C, the electronic components 10 located in the respective passage openings 63 being displaced on the guide plate 21 at the same time. Provided above the guide plate 21 and at a distance from the latter is a guide covering 29. The carrier tape 61 is pulled along between the latter and the guide plate 21.

In order to prevent the electronic component 10 falling downwards through the first opening 23 in the guide plate 21 after the lifting needle 43 has been set down, the vacuum pipette 42 holds the electronic component 10 until the lifting needle 43 has moved back and the component has been wiped off the vacuum pipette by the tape advance. In order to provide further increased safety against such falling out, provision can be made, in one variant, for the vacuum pipette 42 to carry out not only a vertical lifting movement in the lifting direction A but also a slight horizontal movement in the conveying direction C of the carrier tape 6, until the electronic component 10 is resting safely on the guide plate 21 and slides along on the latter.

Figure 3:
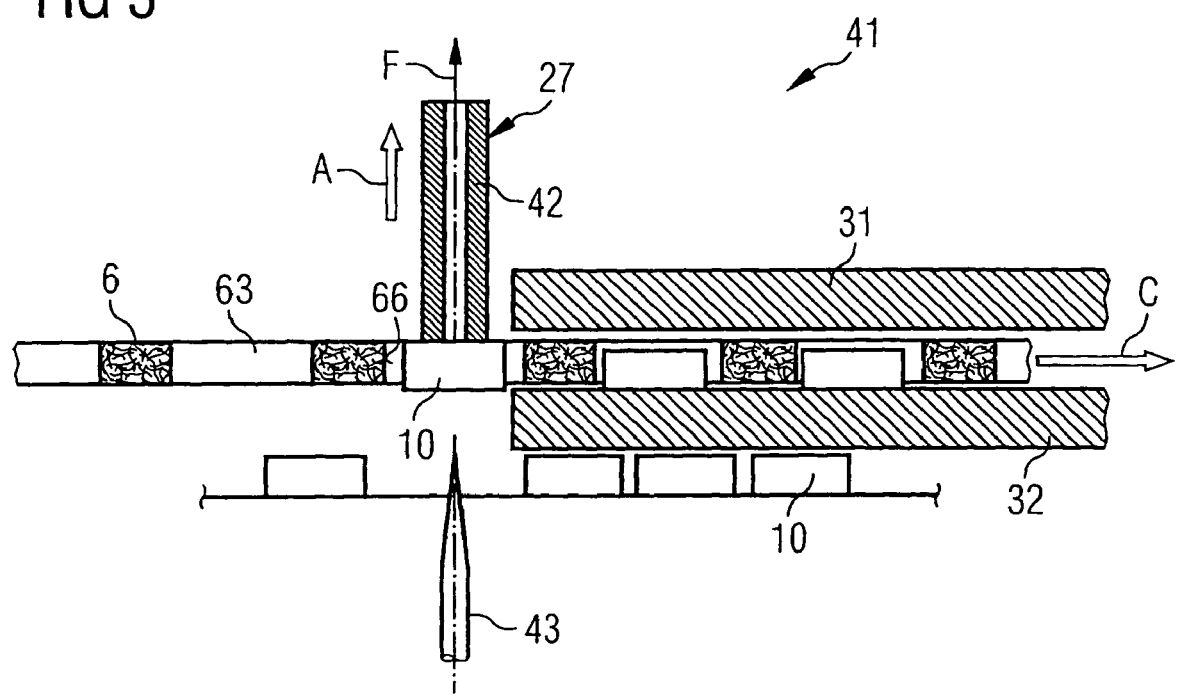
FIG. 3 illustrates a basic sketch of the pick-up device of a further embodiment of the invention.

FIG. 3 illustrates a basic sketch of the pick-up device 41 of a further embodiment of the invention. The components with the same functions as in the preceding figures are identified by the same reference symbols.

The carrier tape 6 is arranged with its passage openings 63 or cavities between an upper guide 31 and a lower guide 32. A film with electronic components 10 is fitted underneath the lower guide. This film is pierced by the lifting needle 43 in order to lift a component 10 and transfer it to a vacuum pipette 42.

In this case, the lower opening of the vacuum pipette 42 is covered by the component 10. An airstream produced by a vacuum pump, not shown in this view, is interrupted and a vacuum is produced in the inner channel in the vacuum pipette 42. As a result of the pressure difference built up in the process between the inner channel in the vacuum pipette 42 and the outer side of the vacuum pipette 42, the component 10 is pressed against the vacuum pipette 42. In this case, a pressure sensor, not shown in this view, is provided on the inner channel in the vacuum pipette 42, by means of which a controller, not shown in this view, is informed as to whether there is a component 10 on the upper opening of the vacuum pipette 42 or not. In addition to the pressure sensor or alternatively thereto, an airflow sensor can be provided, which detects whether more than a minimum quantity of air is flowing through the inner channel in the vacuum pipette 42. If this is the case, there is no component on the lower opening of the vacuum pipette 42.

The vacuum in the inner channel in the vacuum pipette 42 is set to be just so high that the component 10 is held on the lower opening of the vacuum pipette 42 and does not fall off it.

The vacuum pipette 42 lifts the electronic component 10 into the cavity or passage opening 63 in the carrier tape 6. As the tape 6 is pulled horizontally between the upper guide 31 and the lower guide 32, one edge 66 of the tape carries the electronic component with it and wipes it gently off the vacuum pipette. Because of the lower holding force of the minimized vacuum in the vacuum pipette 42, only a little friction has to be overcome in the process. In this case, the electronic component 10 is held by the tip of the vacuum pipette in the direction of arrow F by means of vacuum suction until the lower opening of the vacuum pipette 42 partly releases it. At this moment, it is picked up and carried by the guides 31 and 32.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method of populating a carrier tape with components, comprising:

providing a packaging system;

providing a carrier tape in the packaging system with passage openings for populating the carrier tape with components;

picking up individual components from a support table arranged underneath a guide plate of the packaging system by means of a vacuum pipette;

lifting the component into one of the passage openings in the carrier tape by means of a vertical lifting movement of the vacuum pipette;

wiping the component off the vacuum pipette by means of the carrier tape;

picking up the component and the carrier tape as they are wiped off the vacuum pipette by means of an upper guide and by means of a lower guide;

closing an upper side of the tape by applying an upper cover film; and closing an under side of the tape by applying a lower cover film.

2. The method of claim 1, wherein the components are lifted from below by a lifting needle.

3. The method of claim 2, wherein the vacuum pipette and the lifting needle carry out a vertical lifting movement through a first opening in the guide plate.

4. The method of claim 1, wherein at least the vacuum pipette cries out a horizontal movement in a conveying direction of the carrier tape as it inserts a component into a passage opening in the carrier tape.

5. The method of claim 1, wherein the lower cover film is applied underneath a vacuum suction device, which prevents the components falling out of the passage openings in the carrier tape.

6. The method of claim 1, wherein the upper and lower cover film are applied by means of a heating device in an adhesive manner to the upper side of the tape and to the underside of the tape.

7. The method of claim 1, wherein the upper and the lower cover film are adhesively bonded to the upper side and underside of the tape.

8. The method of claim 1, wherein the carrier tape used is a paper tape which has passage openings to hold components.

9. A method of placing components on a carrier tape within a packaging system, the method comprising:

picking up individual components from a support table arranged underneath a guide plate of the packaging system by a lifting means;

lifting the component into a passage openings in the carrier tape by means of a vertical lifting movement of the lifting means;

wiping the component off the lifting means with the carrier tape; picking up the component and the carrier tape as they are wiped off the lifting means with an upper guide and with a lower guide;

closing an upper side of the tape by applying an upper cover film; and closing an under side of the tape by applying a lower cover film.

10. The method of claim 9, wherein the components are lifted from below by a lifting needle.

11. The method of claim 10, wherein the lifting means comprises a vacuum pipette.

12. The method of claim 11, wherein the vacuum pipette and the lifting needle carry out a vertical lifting movement through a first opening in the guide plate.

13. The method of claim 11, wherein at least the vacuum pipette carries out a horizontal movement in a conveying direction of the carrier tape as it inserts a component into a passage opening in the carrier tape.

14. The method of claim 11, wherein the lower cover film is applied underneath a vacuum suction device, which prevents the components falling out of the passage openings in the carrier tape.

15. The method of claim 11, wherein the upper and lower cover film are applied by means of a heating device in an adhesive manner to the upper side of the tape and to the underside of the tape.

16. The method of claim 11, wherein the upper and the lower cover film are adhesively bonded to the upper side and underside of the tape.

17. The method of claim 11, wherein the carrier tape used is a paper tape which has passage openings to hold components.

* * * * *

UNITED STATES PATENT AND TRADEMARK OFFICE
CERTIFICATE OF CORRECTION

PATENT NO. : 7,204,068 B2
APPLICATION NO. : 10/511945
DATED : April 17, 2007
INVENTOR(S) : Oskar Neuhoff and Peter Roider It is certified that error appears in the above-identified patent and that said Letters Patent is hereby corrected as shown below:

Column 1, line 13, delete "incoirorated" and insert in place thereof --incorporated--.

Column 5, line 8, delete "case be" and insert in place thereof --case can be--.

Column 8, line 43, delete "cries" and insert in place thereof --carries--.

Column 9, line 2, insert new indented paragraph beginning with --picking up…--.

Signed and Sealed this

Eighteenth Day of December, 2007

JON W. DUDAS
*Director of the United States Patent and Trademark Office*